United States Patent
Tran et al.

(10) Patent No.: US 7,808,260 B2
(45) Date of Patent: Oct. 5, 2010

(54) PROBES FOR A WAFER TEST APPARATUS

(75) Inventors: Lich Thanh Tran, San Jose, CA (US); Edward Lambert Malantonio, Conshohocken, PA (US); Edward T. Laurent, Maple Glen, PA (US); Ilan Hanoon, Glenside, PA (US); Dan Mironescu, Yoqneam Elite (IL)

(73) Assignee: Kulicke And Soffa Industries, Inc., Willow Grove, PA (US)

( * ) Notice: Subject to any disclaimer, the term of this patent is extended or adjusted under 35 U.S.C. 154(b) by 85 days.

(21) Appl. No.: 11/885,107

(22) PCT Filed: Feb. 16, 2006

(86) PCT No.: PCT/US2006/005362
§ 371 (c)(1),
(2), (4) Date: Jun. 24, 2008

(87) PCT Pub. No.: WO2006/091454
PCT Pub. Date: Aug. 31, 2006

(65) Prior Publication Data
US 2008/0258746 A1 Oct. 23, 2008

Related U.S. Application Data

(60) Provisional application No. 60/656,069, filed on Feb. 24, 2005.

(51) Int. Cl.
G01R 31/02 (2006.01)
(52) U.S. Cl. .................. 324/761; 324/754; 324/762
(58) Field of Classification Search ................ 324/754, 324/761, 762
See application file for complete search history.

(56) References Cited

U.S. PATENT DOCUMENTS

| | | | |
|---|---|---|---|
| 5,764,072 A * | 6/1998 | Kister | 324/754 |
| 6,429,029 B1 | 8/2002 | Eldridge et al. | |
| 7,091,729 B2 * | 8/2006 | Kister | 324/754 |
| 7,148,709 B2 * | 12/2006 | Kister | 324/754 |
| 7,151,385 B2 * | 12/2006 | Hirata et al. | 324/754 |
| 7,256,592 B2 * | 8/2007 | Hosaka et al. | 324/754 |
| 7,393,773 B2 * | 7/2008 | Malantonio et al. | 438/613 |
| 2001/0026166 A1 | 10/2001 | Khoury et al. | |
| 2001/0054906 A1 * | 12/2001 | Fujimura | 324/754 |

(Continued)

FOREIGN PATENT DOCUMENTS

WO WO 2004/084295 A1 9/2004

OTHER PUBLICATIONS

The International Bureau of WIPO, "International Preliminary Report on Patentability and Written Opinion", PCT/2006/005362, dated Sep. 17, 2007, 8 pages.

*Primary Examiner*—Minh N Tang
(74) *Attorney, Agent, or Firm*—Hickman Palermo Truong & Becker LLP

(57) ABSTRACT

A probe configured for use in the testing of integrated circuits includes a first end portion terminating in a foot (42), the foot defining a substantially flat surface configured to be connected to a substrate (400), a second end portion terminating in a tip (50), the tip being configured to contact an integrated circuit during testing of the integrated circuit, and a curved body portion (56) extending between the first end portion and the second end portion.

22 Claims, 8 Drawing Sheets

U.S. PATENT DOCUMENTS

| | | | |
|---|---|---|---|
| 2002/0017915 A1* | 2/2002 | Kamiya | 324/754 |
| 2002/0055282 A1* | 5/2002 | Eldridge et al. | 439/66 |
| 2005/0189958 A1* | 9/2005 | Chen et al. | 324/762 |
| 2006/0028220 A1* | 2/2006 | Malantonio et al. | 324/754 |
| 2006/0087335 A1* | 4/2006 | Hantschel et al. | 324/762 |
| 2006/0145715 A1* | 7/2006 | Salmon | 324/754 |
| 2009/0174423 A1* | 7/2009 | Klaerner et al. | 324/754 |

* cited by examiner

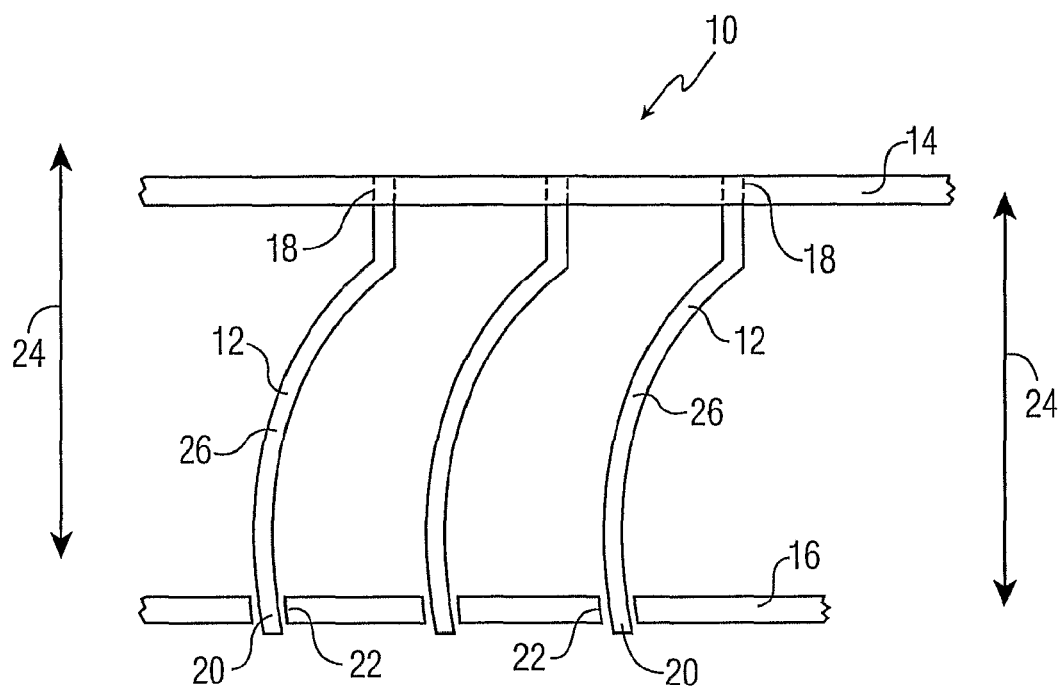
FIG. 1 -- Prior Art --
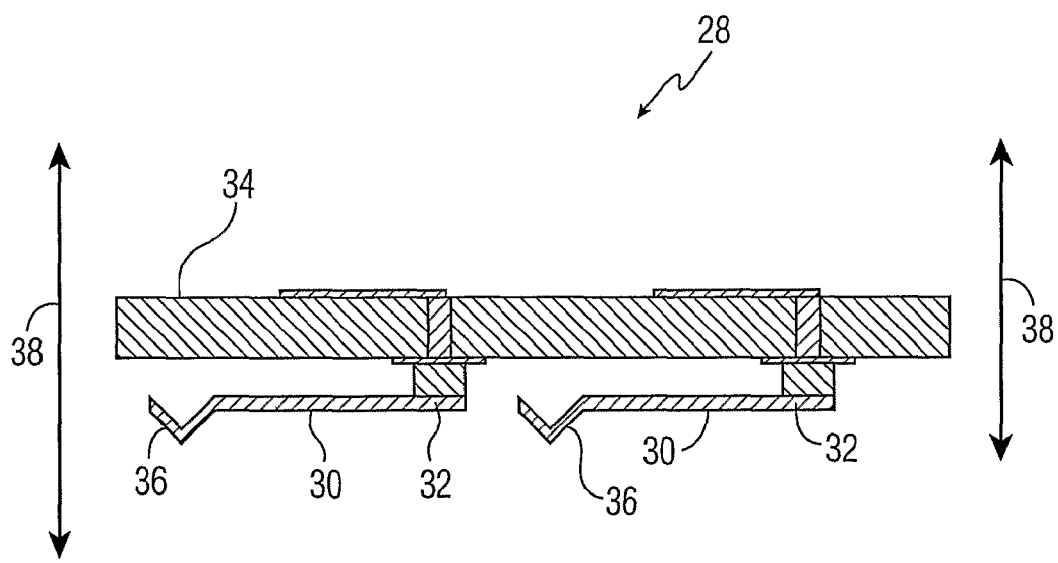
FIG. 2 -- Prior Art --

US 7,808,260 B2

PROBES FOR A WAFER TEST APPARATUS

CROSS-REFERENCED TO RELATED APPLICATIONS

This application claims the benefit of U.S. Provisional Application No. 60/656,069, filed Feb. 24, 2005, the contents of which are incorporated herein by reference.

FIELD OF THE INVENTION

The present invention relates to integrity testing of semiconductor devices, and more particularly, to probes for an apparatus for testing integrated circuits on silicon wafers.

BACKGROUND OF THE INVENTION

Integrated circuits typically include a thin chip of silicon, which is formed by dicing a wafer. Each integrated circuit includes a plurality of input/output pads or the like that are formed on the silicon wafer. In order to assess the operational integrity and other characteristics of the wafer prior to dicing, the silicon wafer is subjected to testing to identify defective circuits.

Known apparatuses for testing silicon wafers include a test controller, which generates integrity test signals, and a probe card, which forms an electrical interface between the test controller and a silicon wafer under test by the apparatus. Known, probe cards typically include three major components: (1) an array of test probes; (2) a space transformer; and (3) a printed circuit board ("PCB"). The test probes, which are typically elongated, are arranged for contact with the input/output pads defined by the silicon wafer under test by the apparatus. The space transformer is respectively connected at opposite sides to the test probes and to the PCB, and converts the relatively high density spacing associated with the array of probes to a relatively low density spacing of electrical connections of the PCB.

Exemplary known test apparatuses include probes referred to as "vertical" or "cantilever" probes, depending on the manner in which the probes are supported and loaded. Referring to FIG. 1, there is shown a prior probe assembly 10 having "vertical" probes 12. Probe assembly 10 includes first and second plates 14, 16 maintained in spaced relation with respect to each other. Each of probes 12 of vertical probe assembly 10 is secured at first end 18 to first plate 14 and is received at second end 20 of probe 12 through opening 22 in second plate 16. As shown, the portions of each probe 12 adjacent first and second ends 18, 20 are oriented substantially parallel to the vertical movement direction for probe assembly 10, which is shown in FIG. 1 by arrows 24.

Because of the vertical orientation of the ends 18, 20 of probes 12, loads will be applied substantially axially at the second end 20 of each probe 12 upon contact with a device under test (DUT), and will be reacted substantially axially at first end 18. In this manner, probes 12 function like vertically-oriented column structures. Unlike typical column structures, however, vertical probes 12 are not straight and, instead, include curved intermediate portion 26 such that first and second ends 18, 20 of each of probes 12 are offset from each other. This construction facilitates deflection of probes 12 for predictable response of probes 12 when they are loaded upon contact with a device under test.

Referring to FIG. 2, there is shown prior probe assembly 28 having "cantilever" probes 30. As shown, each of probes 30 is secured at first end 32 to probe support plate 34. Each of probes 30 includes second end 36 that is V-shaped to define a point adapted for contact with a device under test. In contrast to probes 12 of FIG. 1 having ends 18, 20 parallel to the vertical movement of probe assembly 10, each of probes 30 is oriented substantially perpendicular to the vertical movement of probe assembly 28, identified in FIG. 2 by arrows 38. As a result, loading will be applied transversely to each probe 30 upon contact between second end 36 of probe 30 and a device under test. In this manner, probes 30 function like cantilever beam structures. The cantilever construction of probes 30 greatly facilitates deflection of the probes upon contact with a device under test.

SUMMARY OF THE INVENTION

According to an exemplary embodiment of the present invention, a probe configured for use in the testing of integrated circuits is provided. The probe includes (a) a first end portion terminating in a foot, the foot defining a substantially flat surface configured to be connected to a substrate, (b) a second end portion terminating in a tip, the tip being configured to contact an integrated circuit during testing of the integrated circuit, and (c) a curved body portion extending between the first end portion and the second end portion.

According to another exemplary embodiment of the present invention, a probe card is provided. The probe card includes a substrate and a plurality of probes connected to the substrate. Each of the probes includes (a) a first end portion terminating in a foot, the foot defining a substantially flat surface configured to be connected to the substrate, (b) a second end portion terminating in a tip, the tip being configured to contact an integrated circuit during testing of the integrated circuit, and (c) a curved body portion extending between the first end portion and the second end portion.

BRIEF DESCRIPTION OF THE DRAWINGS

For the purpose of illustrating the invention, there is shown in the drawings a form that is presently preferred; it being understood, however, that this invention is not limited to the precise arrangements and instrumentalities shown. In the drawings:

FIG. 1 is a side view of a prior probe assembly for a wafer test apparatus having vertical probes;

FIG. 2 is a side view of a prior probe assembly for a wafer test apparatus having cantilever probes;

DETAILED DESCRIPTION OF THE DRAWINGS

Figure 3:
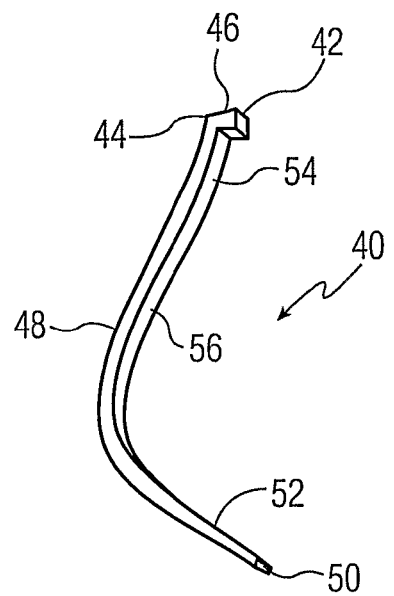
FIG. 3 is a perspective view of a substantially J-shaped probe for a wafer test apparatus according to an exemplary embodiment of the present invention.

According to an exemplary embodiment of the present invention, a probe comprises a body defining a curved configuration adapted to provide close side-by-side spacing of a plurality of the probes. Each of the probes may include a foot at a first end of the probe including a substantially planar end face for bonding the probe to a substrate surface.

For example, the body of the probe includes a first end portion extending from the foot at an oblique angle, $\theta_1$, with respect to the foot end face that is less than 90 degrees. The probe body also includes a second end portion defining a second end of the probe for contacting a surface of a device under test. The body of the probe also includes an intermediate portion between the first and second end portions that is curved such that the orientation of probe body within the intermediate portion is increased between the first and second body portions from $\theta_1$ to an oblique angle, $\theta_2$, with respect to the foot end face that is greater than 90 degrees.

According to another exemplary embodiment of the present invention, the second end portion of the probe body is substantially straight along its entire length, and oriented at the angle $\theta_2$, such that the probe defines a generally L-shaped or J-shaped configuration (depending on which side the probe is viewed from). The second end of the probe may be tapered in cross section along at least part of its length to facilitate deflection in the second end portion.

According to yet another exemplary embodiment of the present invention, the second end portion of the probe includes a substantially straight part oriented at angle at the angle $\theta_2$ and a curved part located at a terminal end of the body. The curved part of the second end portion is adapted to reduce the angle of the probe body with respect to the foot end face from $\theta_2$ to substantially vertical (perpendicular to the foot end face) at the terminal end of the probe. Because the second end portion of the probe body includes the curving part, the probe is generally S-shaped in appearance.

According to yet another exemplary embodiment of the present invention, a probe comprises a foot adapted for engagement with a pickup/bonding tool and a body connected to the foot. The foot includes a substantially planar end face for bonding the probe to a substrate surface and a first side face substantially perpendicular to the end face. The foot also includes a sloped top face oriented at an oblique angle with respect to the first side face such that the top face slopes toward the end face from the first side face. In certain exemplary probes, the angle between the first side face and the sloped top face is approximately 85 degrees. The sloping of the top face of foot provides for engagement between the foot and a pickup/bonding tool having a correspondingly sloped surface.

According to yet another exemplary embodiment of the present invention, the foot also includes an intermediate face located between the first side face and the sloped top face such that a corner that would otherwise be included in the foot is eliminated. In certain exemplary probes, the intermediate face is located at an angle of 150 degrees from the first side face.

Figure 4:
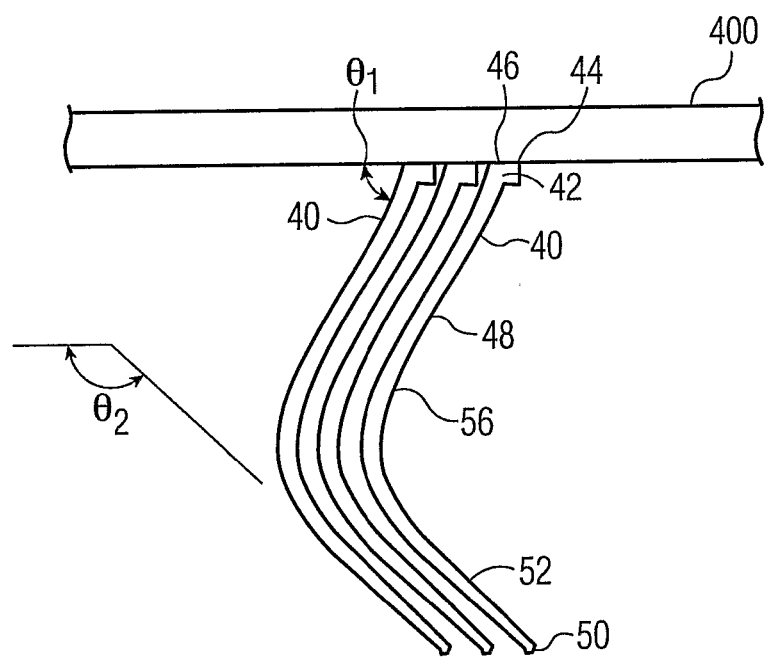
FIG. 4 is a side view of a plurality of probes similar to the probe of FIG. 1 arranged in side-by-side fashion.

Referring to the drawings, where like numerals identify like elements, there is illustrated in FIGS. 3 and 4, probe 40 for an apparatus for testing integrated circuits on silicon wafers. Probe 40 includes substantially rectangular foot portion 42 at first end 44 having substantially planar end face 46 to facilitate a bonded connection between probe 40 and a substrate support surface, such as a surface defined by probe card substrate 400 (shown in FIG. 4), for example. Such a substrate (to which probes are connected in accordance with the present invention) may be a multi-layer ceramic substrate, a multi-layer organic substrate, a printed circuit board, etc., and may (or may not be) a space transformer.

Probe 40 includes elongated body 48 extending between foot 42 and second end 50 opposite first end 44. Body 48 of probe 40 is formed into a generally L-shaped or J-shaped configuration, depending on the point of view. As shown in the exemplary shape of FIG. 3, body 48 of probe 40 is rectangular in cross section. Throughout a majority of probe body 48, the rectangular cross section has constant (e.g., substantially square) dimensions. According to a specific example, the substantially square cross section has a depth and a width that are both approximately 3 mils. As shown in FIG. 4, probe body 48 includes second end portion 52 that is tapered such that the depth of the cross section is reduced. The tapering of body 48 reduces the section modulus, thereby reducing the bending stiffness of body second end portion 52.

It is not required that probe 40 have a rectangular cross section. Probe 40 could, alternatively, for example, have a cross section that is rounded in the form of an oval or a circle, or have any other desired shape. A rectangular cross-section for probe 40, however, facilitates the use of an efficient plating process to form the probe, which provides for reduced costs. It is not a requirement, however, that probe 40 be made using a plating process. Probe 40 could be made by any of a number of processes, for example, etching, lasering, stamping, lithographic techniques (e.g., x-ray lithography, photolithography, stereolithogray), etc. Exemplary probes may be formed of NiMn or BeCu.

Referring to FIG. 4, a plurality of probes 40 are arranged in side-by-side fashion. As shown, the L-shaped configuration of probe 40 facilitates a very close spacing between probes 40. For the above-described probe 40 having a substantially square cross section of approximately 3 mils by 3 mils, a plurality of probes 40 may be spaced at a pitch of, for example, between approximately 425 micrometers to approximately 135 micrometers. It should be understood, however, that the invention is not limited to dimensions of approximately 3 mils by 3 mils. The dimensions of probe 40 could, accordingly, be scaled down to provide for probe spacing less than approximately 425 micrometers. Of course, the dimensions could, alternatively be scaled upwards to provide stronger probes 40 capable of larger contact forces and greater current carrying capability. Close spacing of probes 40 as described above, facilitates testing of wafers having densely populated circuit pads, such as those of a flip-chip. As described in greater detail below, the shape of probe 40 also facilitates deflection of probe 46 under loading, desirably providing predictable response of probe 40 upon contact with a device under test (DUT).

Body 48 of probe 40 includes first end portion 54 adjacent first end 44 of probe 40 that extends from foot portion 42 in a substantially straight manner at an oblique angle with respect to end face 46 of foot portion 42, identified in FIG. 4 as $\theta_1$. As shown, the oblique angle $\theta_1$ is less than 90 degrees. Tapered second end portion 52 of body 48 is also substantially straight and is oriented at an oblique angle with respect to the foot end face 46, identified in FIG. 4 as $\theta_2$. Intermediate portion 56 of body 48, located between first and second end portions 54, 52, is curved to shape probe 40 into the generally L-shaped configuration. As shown in FIG. 4, the angle of intermediate portion 56 with respect to foot end face 46 decreases slightly adjacent body first end 44 from $\theta_1$ and then returns increasing beyond $\theta_1$ and beyond 90 degrees (i.e., vertical in FIG. 4) to $\theta_2$ at body second end portion 52.

Figure 5:
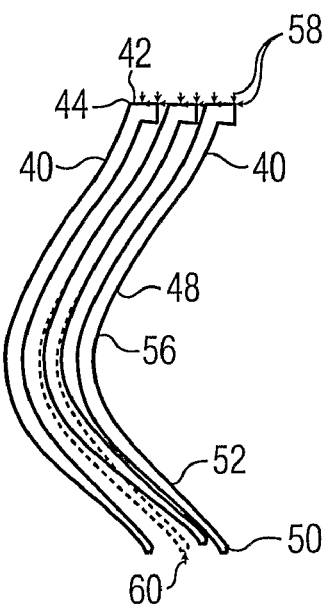
FIG. 5 is a side view of the plurality of probes of FIG. 4, illustrating one of the probes deflected under applied load.

Referring to FIG. 5, a plurality of probes 40 are secured to a support member (not shown), such as a support plate of a probe card for example, as indicated by arrows 58. During use, a vertical force is applied to second end 50 of one of probes 40 as indicated by arrow 60. Such a force could result, for example, through contact between probe 40 and a contact located on a device under test. As illustrated in FIG. 5, the spacing between probes 40, although close, allows loaded probe 40 to deflect without causing deflection of the probes adjacent to loaded probe 40. Also, the generally L-shaped configuration of probe 40 concentrates stresses and deflections in second end portion 52 and intermediate portions 56 of probe body 48. The resulting relatively reduced stresses in first end portion 54 of body 48 desirably promotes the integrity of probe 40 at the junction between body 48 and foot 42 as well as the integrity of the bonded connection between foot 42 and the substrate surface to which probe 40 is secured.

As discussed above, the L-shaped configuration orients second end portion 52 of probe 40 obliquely with respect to foot end face 46. As a result, a portion of contact load 60 is applied transversely to probe 40 at second end 50. Because of the transversely applied load, probe 40 deflects somewhat similarly to prior "cantilever" probes 30 of FIG. 2. The otherwise vertical aspects of probe 40, however, facilitates close spacing of a plurality of the probes in the above-described manner. The configuration of probe 40 is also very compact. For the above described probe having square cross section of approximately 3 mils by 3 mils, the vertical extent of probe 40 between the first and second ends when the probe is not under load is approximately ⅓ that of a conventional vertical probe having similar cross sectional area. The configuration of probe 40, therefore, provides an improved more compact design compared to prior probes, and may also provide reduced contact resistance.

Figure 6:
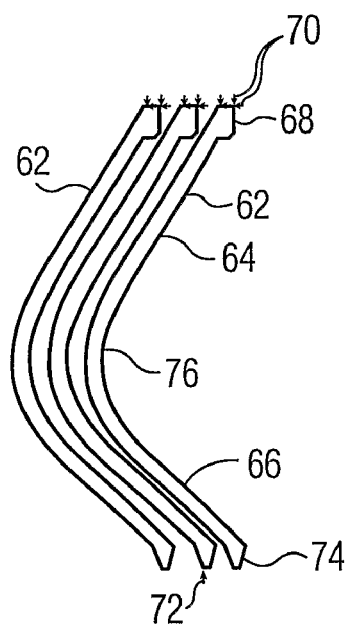
FIG. 6 is a side view of a plurality of test probes arranged in side-by-side fashion and showing one of the probes deflecting under applied load, the probes being similar to the probes of FIG. 5 except lacking a taper and having a modified foot portion compared to the probes of FIG. 5.
Figure 7:
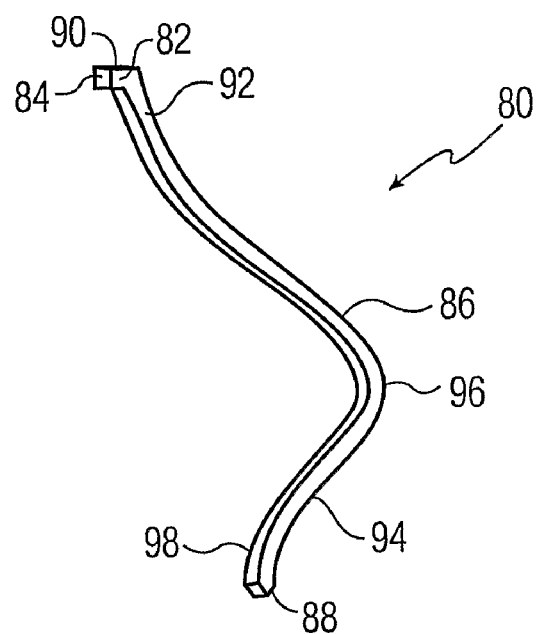
FIGS. 7 and 8 are perspective views of a substantially S-shaped probe for a wafer test apparatus according to an exemplary embodiment of the present invention.

Referring to FIG. 6, there is shown a plurality of probes 62 having an L-shaped configuration similar to that of probes 62 of FIGS. 3 through 5. Probes 62, however, include body 64 having cross-sectional dimensions that are substantially constant throughout body 64. Probes 62, therefore, include second end portions 66 that do not taper like those of probes 40.

Probes 62 of FIG. 6 also differ from probes 40 in that foot 68 is configured differently from foot 42. Foot 68 of probe 62 has a substantially rectangular contact face, but has a more trapezoidal shaped side profile. The trapezoidal shape permits a reduced contact face, thus permitting even closer spacing between probes 62 as shown in FIG. 6. An exemplary spacing pitch between adjacent probes 62 at the point of bonding to a probe substrate is 135 micrometers.

Similar to probes 40 of FIG. 5, probes 62 of FIG. 6 are bonded to a substrate (not shown) as illustrated by arrows 70 (which depict exemplary loads on the contact face of the probe foot). One of probes 62 is shown deflected under a load, illustrated by arrow 72, applied to second end 74 of probe 62. In a similar manner as loaded probe 40 of FIG. 5, the stresses generated in loaded probe 62 of FIG. 6 are principally contained within second end portion 66 and intermediate portion 76 of body 64 of probe 62.

Figure 8:
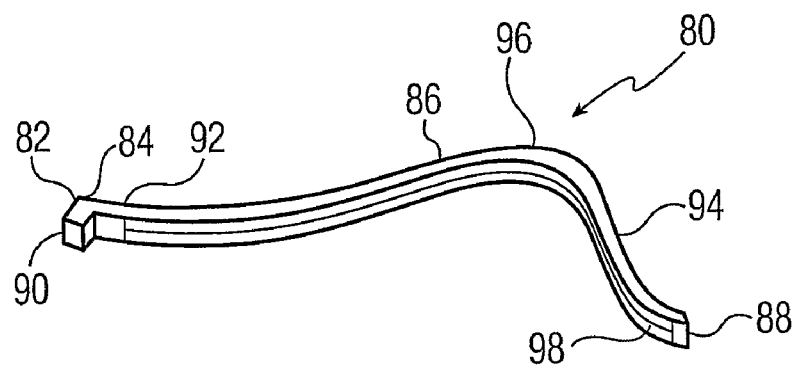

Referring to FIGS. 7-10, probe 80 according to another exemplary embodiment of the present invention is shown which includes foot 82 at first end 84 of probe 80, generally S-shaped body 86, and second end 88. Similar to foot 42 of probe 40, foot 82 includes substantially planar end or contact face 90 for bonding probe 80 to a substrate surface. As shown in FIG. 8, the cross-section of body 86 of probe 80 is, for example, substantially rectangular. According to a specific example, the cross section has a width of approximately 3 mils and a depth of approximately 2 mils. Probe 80, however, could have a different cross-sectional shape including circular or oval, for example.

Figure 9:
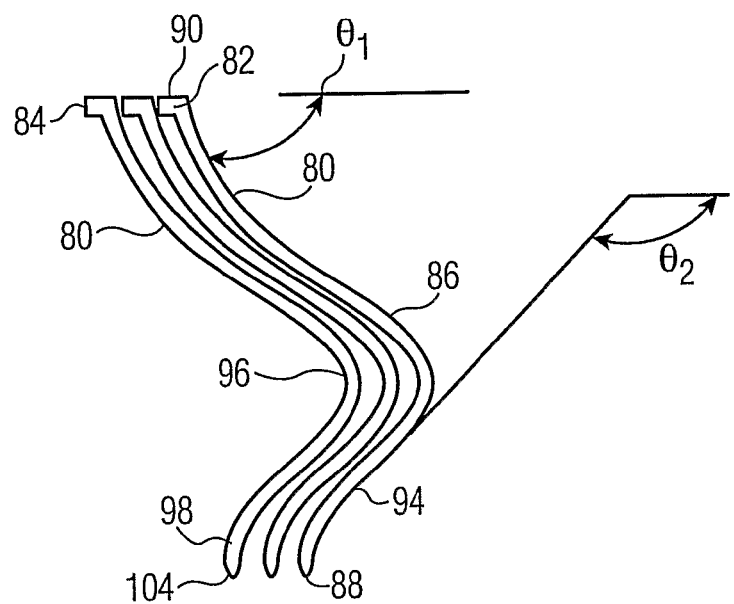
FIG. 9 is a side view of a plurality of probes similar to the probe of FIGS. 7 and 8 arranged in side-by-side fashion.

Body 86 of probe 80 includes first end portion 92 that, similar to first end portion 54 of probe 40, is substantially straight adjacent to foot 82. As shown in FIG. 9, first end portion 92 of body 86 extends from foot 82 at an angle, $\theta_1$, with respect to foot end face 90 that is an oblique angle. As also shown in FIG. 9, the configuration of probe 80 facilitates close spacing between a plurality of probes 80. Similar to the above-described probe 40, probe 80 having a rectangular cross section of approximately 2 mils by 3 mils provides for spacing of the probes at pitches as small as, for example, between approximately 125 micrometers and approximately 135 micrometers.

Probe body 86 includes second end portion 94 and intermediate portion 96 located between first and second end portions 92, 94. In a similar fashion as intermediate body portion 56 of probe 40, intermediate body portion 96 is curved such that the angle between body 86 and foot end face 90 decreases from $\theta_1$ adjacent to body first end portion 92 and then increases beyond vertical (i.e., body 86 perpendicular to foot end face 90). Body second end portion 94 of probe 80, similar to body second end portion 52 of probe 40, includes a substantially straight portion. The straight portion of body second end portion 94 is oriented at an angle, $\theta_2$, with respect to foot end face 90. Unlike second end portion 52 of probe 40, however, which is substantially straight throughout its length, body second end portion 94 of probe 80 includes curved part 98 at terminal end of the probe 80. Curved part 98 of body second end portion 94 is configured to orient second end 88 of the probe, for example, substantially vertical (i.e., perpendicular to foot end face 90). The orientation of second end 88 of probe 80, therefore, is similar to that of prior "vertical" probe 12 (FIG. 1).

Figure 10:
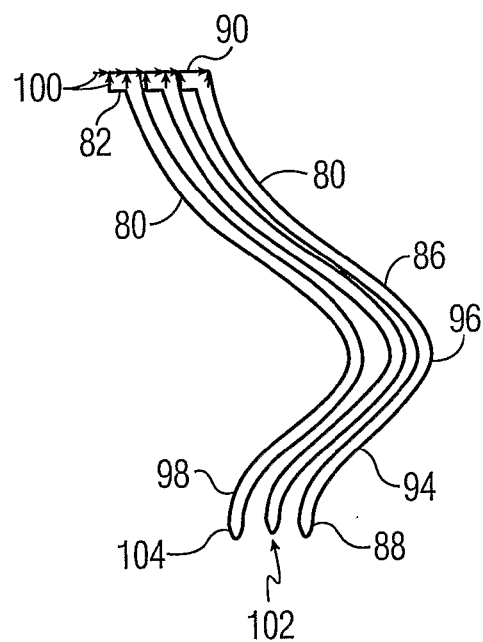
FIG. 10 is a side view of the plurality of probes of FIG. 9 arranged in side-by-side fashion and showing one of the probes deflecting under applied load.

Referring to FIG. 10, a plurality of probes 80 is shown bonded to a substrate (not shown) as illustrated by arrows 100. One of probes 80 is also loaded as indicated by arrow 102, by contact between probe second end 88 and a contact surface, for example. The stresses developed in deflecting probe 80 are concentrated in intermediate and second portions 96, 94 of body 86, thereby protecting the integrity of body first end portion 92 and the bonded connection between foot 82 and the substrate surface. As shown in FIG. 10, the configuration of probe 80 allows for close probe spacing (e.g., pitch between approximately 125 and approximately 135 micrometers) without interference between deflecting probe 80 and adjacently located probes 80.

Similar to probe 40, the configuration of probe 80 provides a very compact configuration having a vertical extent between its first and second ends 84, 88 when probe 80 is not loaded by contact at second end 88, that is approximately ⅓ that of prior vertical probes.

Figure 11:
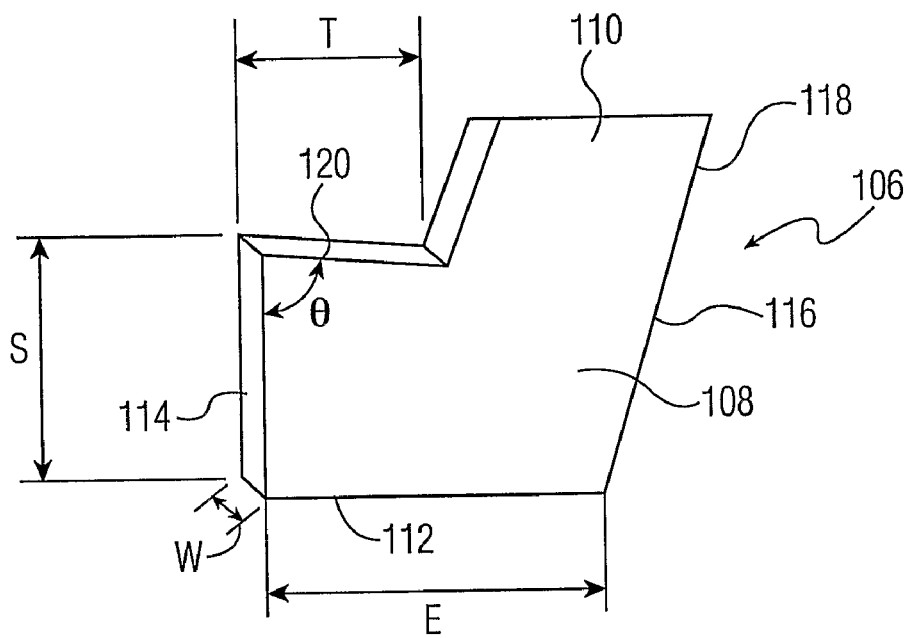
FIG. 11 is a perspective view of a portion of a probe including a foot according to an exemplary embodiment of the present invention.

Referring to FIG. 11, there is shown another exemplary embodiment of the present invention illustrating probe 106 having foot 108 and body 110 connected to foot 108. Similar to the above-described feet, foot 108 includes planar end face 112 for bonding probe 106 to a substrate surface. Foot 108 is substantially rectangular including first side face 114 that is substantially perpendicular to end face 112. An opposite second side face 116 of foot 108 is, preferably, not perpendicular to the end face 112 but is, instead, oriented at an oblique angle to end face 112. This construction provides for a gradual transition between second side face 116 of foot 108 and adjacent surface 118 of probe body 110.

Foot 108 includes top face 120. The illustrated exemplary top face 120 of foot 108 is not perpendicular to first side face 114 but is, instead, oriented at a slightly oblique angle θ to the first side face 114. As shown in FIG. 11, top face 120 of foot 108 slopes slightly downwardly from first side face 114 (in the point of view shown in FIG. 11) towards end face 112. According to an exemplary embodiment of the present invention, the angle between first side face 114 and top face 120 of foot 108 is approximately 85 degrees.

The above-described construction of foot 108 including sloping top face 120 facilitates engagement between foot 108 and a pickup/bonding tool (not shown) and handling of probe 106 during bonding of probe 106 to a substrate surface. Facilitated handling of probe 106 ensures proper probe position and also promotes increased bond quality. A slope angle of 85 degrees between first side face 114 and top face 120 is exemplary in nature and could be any suitable angle.

End face 112, first side face 114 and top face 120 have lengths shown in FIG. 11 as E, S, and T, respectively. Foot 108 has a width shown as W. According to an exemplary embodiment of the present invention, E, S and T are respectively equal to approximately 4 mils, 3 mils and 2.2 mils, respectively and W is equal to approximately 3 mils.

The configuration of foot 108 facilitates formation of probe 106 in a plating process for reduced costs. The slight slope of top face 120 is easier to manufacture than prior foot designs incorporating grooves, dimples or notches. The configuration of foot 108, therefore, provides for greater control over tolerances and improved fit between foot 108 and a pickup/bonding tool having a corresponding sloped surface. Sloped top face 120 of foot 108 provides for engagement between foot 108 and a pickup/bonding tool having a corresponding sloped surface having a length that may vary from T, thereby providing universal application between a given tool and probes having varying foot dimension T.

Engagement between probes and corresponding pickup/bonding tools is typically facilitated by application of a vacuum that is generated by the tool. The configuration of probe foot 108 provides for a precise fit between probes 106 and the tool to facilitate vacuum engagement between the tool and a given probe. Sloped top face 120 of foot 108 also acts as a mechanical lock limiting lateral movement between foot 108 and a tool engaging foot 108. The slope angle of top face 120 of foot 108, however, may be kept relatively small such that disengagement between foot 108 and a pickup/bonding tool may be achieved without the need for significant relative vertical movement between foot 108 and the tool.

Figure 12:
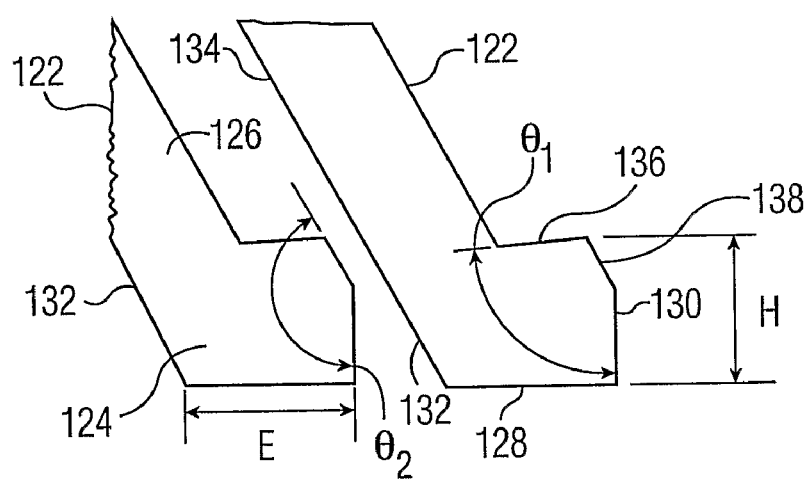
FIG. 12 is a side view of a pair of probes each including a foot according to an exemplary embodiment of the present invention, the probes arranged in side-by-side fashion.

Referring to FIG. 12, there are shown a portion of a pair of probes 122 each having foot 124 and body 126 extending from foot 124. Foot 124 of probe 122 includes end face 128 and first and second side faces 130, 132. Similar to foot 108 of probe 106, first side face 130 of foot 124 is substantially perpendicular to end face 128. Also similar to foot 108, second side face 132 of foot 124 is oriented at an oblique angle with respect to end face 128 to provide gradual transition to adjacent surface 134 of body 126.

Foot 124 includes top face 136 that, similarly to top face 120 of foot 108, is sloped slightly downwardly (in the view of FIG. 12) away from first side face 130 at an oblique angle $\theta_1$ with respect to first side face 130. For example, the slope angle $\theta_1$ is approximately 85 degrees. Unlike foot 108, however, sloped top face 136 of foot 124 does not extend to intersect with first side face 130. Instead, foot 124 includes an intermediate face 138 between first side face 130 and sloped top face 136 such that a corner, which would otherwise be present, is eliminated from foot 124. Intermediate face 138 is oriented with respect to first side face 130 at an angle, $\theta_2$. For example, $\theta_2$ is equal to approximately 150 degrees.

End face 128 has a length shown as E in FIG. 12. The combined length of first side face 130 and vertical extent of intermediate face 138 is shown as H. According to an exemplary embodiment of the present invention, E is equal to approximately 3.4 mils and H is equal to approximately 3 mils.

As shown in FIG. 12, the elimination of the corner from foot 124 facilitates closer spacing between the pair of probes 122 than would otherwise be possible because of interference between the corner of one foot 124 and second side face 132 of other foot 124. The elimination of the corner from foot 124 also facilitates engagement between foot 124 and a pickup/bonding tool (not shown) and limits potential damage to foot 124 and/or tool otherwise occurring from contact between the corner and the tool. In the same manner as top face 120 of foot 108, sloped top face 136 of foot 124 provides for engagement with a correspondingly sloped surface of a pickup/bonding tool and provides a mechanical lock limiting lateral movement between the probe 122 and the tool.

Figure 13:
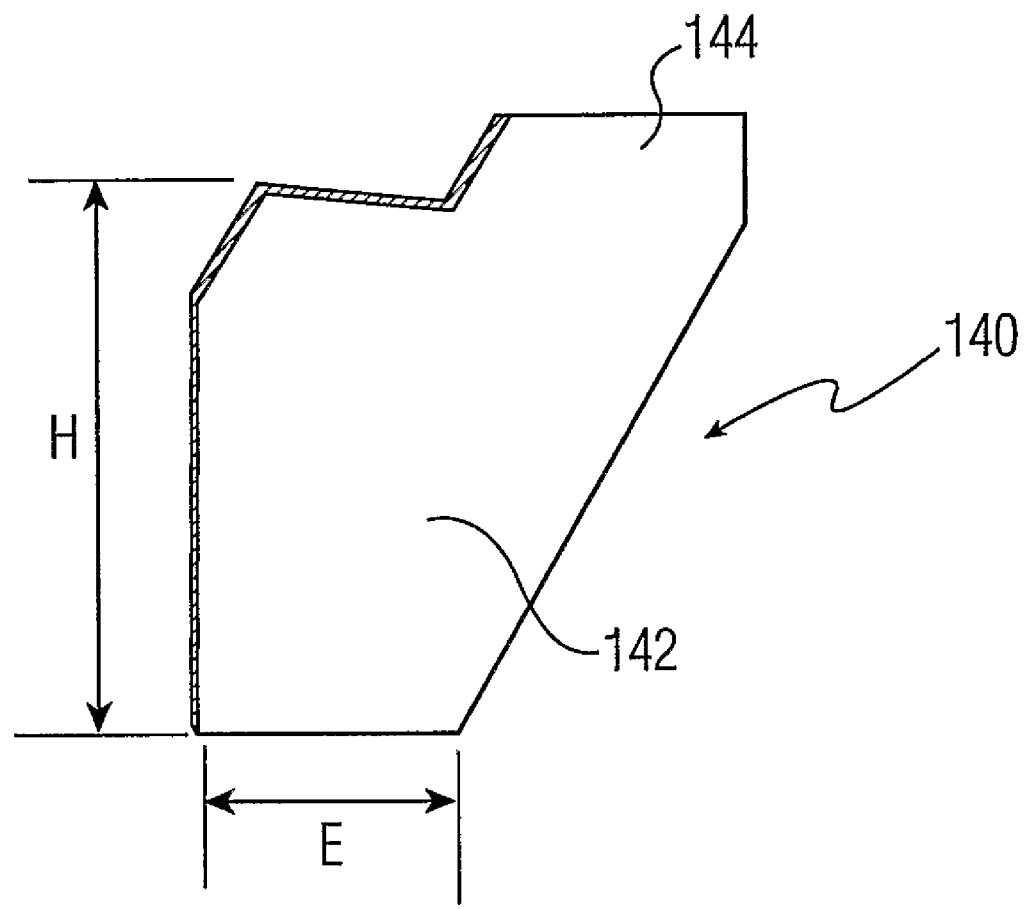
FIG. 13 is a side view of a probe including a foot similar to the foot of FIG. 12 except having a different aspect ratio.

Referring to FIG. 13, there is shown probe 140 having foot 142 and body 144 connected to foot 142. Foot 142 of probe 140 is similar in construction to that of foot 124 of FIG. 12, except that the aspect ratio has been modified such that H (i.e., the combined length of the first side face and the vertical extent of the intermediate face) exceeds E (i.e., the length of the end face. Exemplary dimensions for H is 6 mils and for E is 2.5 mils.

Figure 14A:
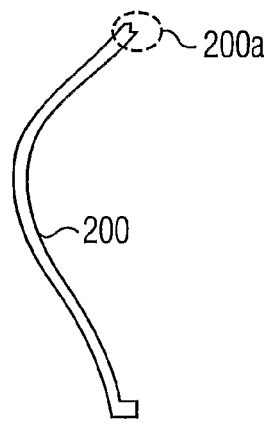
FIG. 14A is a side view of probe according to an exemplary embodiment of the present invention.
Figure 14B:
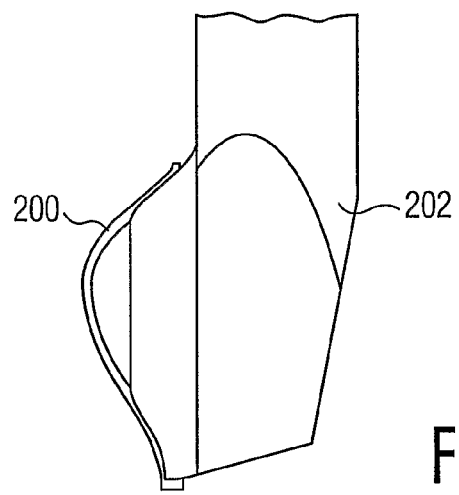
FIG. 14B is a side view of the probe of FIG. 14A engaged with a pickup tool.

Referring to FIG. 14A, probe 200 is illustrated as having certain features (e.g., a curved shape, a foot, etc.) similar to previously described probes in accordance with the present invention. FIG. 14B illustrates probe 200 engaged with pickup/bonding tool 202. For example, tool 202 may be a vacuum tool, and may further define a groove for receiving probe 200 via a vacuum. As shown in FIG. 14B, tool 202 is shaped to engage the upper and lower end portions of probe 200.

Figure 14C:
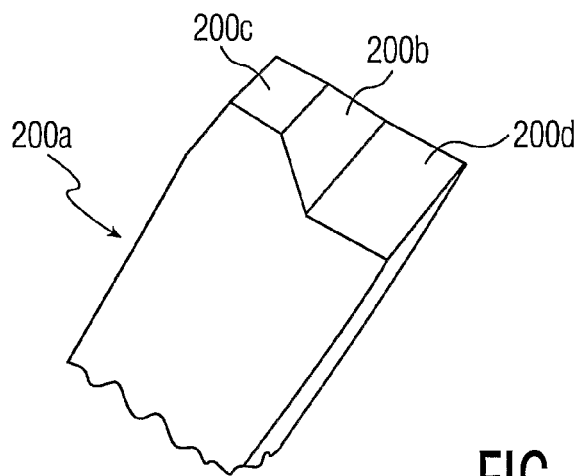
FIG. 14C is a detailed perspective view of a portion of the probe of FIG. 14A.

Portion 200a of probe 200 shown in FIG. 14A is detailed in FIG. 14C (portion 200a is shown in a side view in FIG. 14A, but partially rotated in FIG. 14C). As shown in FIG. 14A, probe 200 includes tip portion 200b (e.g., a non-pointed pyramid shaped tip portion) terminating in surface 200c which is configured to contact a pad of a DUT during testing thereof. Tip portion 200b may be at least partially shaped after probe 200 is formed. For example, surface 200c of tip portion 200b may be on the order of 1 square mil, and as such, may be difficult to detect using conventional vision systems (e.g., vision systems for use during probe card analysis, metrology inspection, etc.). Surface 200d (e.g., a non-contact surface) is defined to be larger than surface 200c such that it reflects light easier in connection with vision systems. For example, in probe 200 having a 1 square mil tip surface 200c, surface 200d may be approximately 1 mil×3 mils.

The foregoing describes the invention in terms of embodiments foreseen by the inventor for which an enabling description was available, notwithstanding that insubstantial modifications of the invention, not presently foreseen, may nonetheless represent equivalents thereto.

What is claimed:

1. A probe configured for use in the testing of integrated circuits, the probe comprising:
   a first end portion terminating in a foot, the foot defining a substantially flat surface configured to be connected to a substrate;
   a second end portion terminating in a tip, the tip being configured to contact an integrated circuit during testing of the integrated circuit; and
   a curved body portion extending between the first end portion and the second end portion,
   wherein the foot includes a top surface opposite the substantially flat surface, the top surface meeting a face of the curved body portion at an edge and at an angle of less than 180 degrees, and
   wherein for at least one of a plurality of probes connected to the substrate, an axis perpendicular to and intersecting the substantially flat surface of the at least one of the plurality of probes intersects the curved body portion of an adjacent probe.

2. The probe of claim 1 wherein a cross sectional dimension of each of the first end portion, the second end portion, and the curved body portion is substantially similar.

3. The probe of claim 1 wherein the probe is tapered such that a cross sectional dimension of at least a portion of the second end portion is smaller than a corresponding cross sectional dimension of the curved body portion.

4. The probe of claim 1 wherein the second end portion defines a substantially flat surface adjacent the tip, the substantially flat surface having a larger area than a contact surface area of the tip.

5. The probe of claim 1 wherein the probe is shaped such that the foot has a smallest cross-sectional area along the substantially flat surface of the foot.

6. The probe of claim 1 wherein the foot is substantially rectangular.

7. The probe of claim 1 wherein the top surface of the foot is sloped relative to the substantially flat surface of the foot.

8. The probe of claim 7 wherein an angle between the top surface of the foot and a side face of the foot is less than 90 degrees.

9. The probe of claim 7 wherein an angle between the top surface of the foot and a side face of the foot is approximately 85 degrees.

10. The probe of claim 7 wherein a junction between the top surface of the foot and a side face of the foot is not a square junction.

11. The probe of claim 1 wherein a side face of the foot not directly adjacent the substantially flat surface of the foot is provided at an angle other than 90 degrees with respect to the substantially flat surface of the foot.

12. A probe card comprising:
    a substrate; and
    a plurality of probes connected to the substrate, each of the probes comprising (a) a first end portion terminating in a foot, the foot defining a substantially flat surface configured to be connected to the substrate, (b) a second end portion terminating in a tip, the tip being configured to contact an integrated circuit during testing of the integrated circuit, and (c) a curved body portion extending between the first end portion and the second end portion,
    wherein the foot includes a top surface opposite the substantially flat surface, the top surface meeting a face of the curved body portion at an edge and at an angle of less than 180 degrees; and
    wherein for at least one of a plurality of probes connected to the substrate, an axis perpendicular to and intersecting the substantially flat surface of the at least one of the plurality of probes intersects the curved body portion of an adjacent probe.

13. The probe card of claim 12 wherein a cross sectional dimension of each of the first end portion, the second end portion, and the curved body portion is substantially similar.

14. The probe card of claim 12 wherein each of the probes is tapered such that a cross sectional dimension of at least a portion of the second end portion is smaller than a corresponding cross sectional dimension of the curved body portion.

15. The probe card of claim 12 wherein the second end portion defines a substantially flat surface adjacent the tip, the substantially flat surface being larger than a contact surface of the tip.

16. The probe card of claim 12 wherein the probe is shaped such that the foot of each of the plurality of probes has a smallest cross-sectional area along the substantially flat surface of the foot.

17. The probe card of claim 12 wherein the foot is substantially rectangular.

18. The probe card of claim 12 wherein the top surface of the foot is sloped relative to the substantially flat surface of the foot.

19. The probe card of claim 18 wherein an angle between the top surface of the foot and a side face of the foot is less than 90 degrees.

20. The probe card of claim 18 wherein an angle between the top surface of the foot and a side face of the foot is approximately 85 degrees.

21. The probe card of claim 18 wherein a junction between the top surface of the foot and a side face of the foot is not a square junction.

22. The probe card of claim 12 wherein a side face of the foot not directly adjacent the substantially flat surface of the foot is provided at an angle other than 90 degrees with respect to the substantially flat surface of the foot.

* * * * *

UNITED STATES PATENT AND TRADEMARK OFFICE
CERTIFICATE OF CORRECTION

| | | |
|---|---|---|
| PATENT NO. | : 7,808,260 B2 | Page 1 of 1 |
| APPLICATION NO. | : 11/885107 | |
| DATED | : October 5, 2010 | |
| INVENTOR(S) | : Lich Thanh Tran et al. | |

It is certified that error appears in the above-identified patent and that said Letters Patent is hereby corrected as shown below:

On the title page, replace:

Item -- (73) Assignee:  Kulicke And Soffa Industries, Inc.
                        Willow Grove, PA (US) --

With

-- (73) Assignee:  SV Probe PTE LTD
                   Singapore, Singapore --

Signed and Sealed this
Fourteenth Day of June, 2011

David J. Kappos
*Director of the United States Patent and Trademark Office*